(12) United States Patent
Singh

(10) Patent No.: US 6,281,521 B1
(45) Date of Patent: *Aug. 28, 2001

(54) SILICON CARBIDE HORIZONTAL CHANNEL BUFFERED GATE SEMICONDUCTOR DEVICES

(75) Inventor: Ranbir Singh, Cary, NC (US)

(73) Assignee: Cree Research Inc., Durham, NC (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/112,686

(22) Filed: Jul. 9, 1998

(51) Int. Cl.$^7$ ................................................ H01L 21/265
(52) U.S. Cl. .......................... 257/77; 257/200; 257/339; 257/550; 257/607; 257/612; 257/613; 257/614
(58) Field of Search ............................ 257/77, 200, 339, 257/500, 607, 612, 613, 614

(56) References Cited

U.S. PATENT DOCUMENTS

| | | | |
|---|---|---|---|
| 4,071,945 | 2/1978 | Karatsjuka et al. | 29/578 |
| 4,654,958 | 4/1987 | Baerg et al. | 29/571 |
| 4,717,677 | 1/1988 | McLaughlin et al. | 437/24 |
| 4,805,003 | 2/1989 | Holm et al. | 357/22 |
| 5,030,580 | 7/1991 | Furukawa et al. | 437/22 |
| 5,077,589 | 12/1991 | Holm et al. | 357/23.4 |
| 5,087,576 | 2/1992 | Edmond et al. | 437/22 |
| 5,135,885 | 8/1992 | Furukawa et al. | 437/100 |
| 5,170,231 | 12/1992 | Fujii et al. | 257/232 |
| 5,216,264 | 6/1993 | Fujii et al. | 257/284 |
| 5,233,215 | 8/1993 | Baliga | 257/490 |
| 5,270,244 | 12/1993 | Baliga | 437/67 |
| 5,318,915 | 6/1994 | Baliga et al. | 437/24 |
| 5,322,802 | 6/1994 | Baliga et al. | 437/22 |
| 5,323,040 | 6/1994 | Baliga | 257/332 |
| 5,338,945 | 8/1994 | Baliga et al. | 257/77 |

(List continued on next page.)

FOREIGN PATENT DOCUMENTS

| | | | |
|---|---|---|---|
| 196 08 003 A1 | 3/1996 | (DE) | H01L/29/78 |
| 196 44 821 C1 | 10/1996 | (DE) | H01L/29/80 |
| 0 687 015 A2 | 12/1995 | (EP) | H01L/29/74 |
| 0 703 629 A1 | 3/1996 | (EP) | H01L/29/808 |
| 0 703 629 A3 | 3/1996 | (EP) | H01L/29/808 |
| 0 822 600 A1 | 2/1998 | (EP) | H01L/29/10 |
| 63128741 | 1/1988 | (JP) | H01L/27/08 |
| WO98/12755 | 3/1998 | (WO) | H01L/29/74 |

OTHER PUBLICATIONS

Iwasaki, T., et al., Electrical Characteristics of a Novel Gate Structure 4H–SiC Power Static Induction Transistor, *IEEE*, pp. 149–152 (1997).

(List continued on next page.)

*Primary Examiner*—Fetsum Abraham
(74) *Attorney, Agent, or Firm*—Myers Bigel Sibley & Sajovec

(57) ABSTRACT

Silicon carbide channel semiconductor devices are provided which eliminate the insulator of the gate by utilizing a semiconductor gate layer and buried base regions to create a "pinched off" gate region when no bias is applied to the gate. In particular embodiments of the present invention, the semiconductor devices include a silicon carbide drift layer of a first conductivity type, the silicon carbide drift layer having a first face and having a channel region therein. A buried base region of a second conductivity type semiconductor material is provided in the silicon carbide drift layer so as to define the channel region. A gate layer of a second conductivity type semiconductor material is formed on the first face of the silicon carbide drift layer adjacent the channel region of the silicon carbide drift layer. A gate contact may also be formed on the gate layer. Both transistors and thyristors may be provided.

33 Claims, 5 Drawing Sheets

U.S. PATENT DOCUMENTS

| | | | |
|---|---|---|---|
| 5,396,085 | 3/1995 | Baliga | 257/77 |
| 5,397,717 | 3/1995 | Davis et al. | 437/40 D |
| 5,399,883 | 3/1995 | Baliga | 257/57 |
| 5,436,174 | 7/1995 | Baliga et al. | 431/22 |
| 5,449,925 | 9/1995 | Baliga et al. | 257/77 |
| 5,510,281 | 4/1996 | Ghezzo et al. | 437/41 |
| 5,543,637 | 8/1996 | Baliga | 257/77 |
| 5,681,762 | 10/1997 | Baliga | 437/22 |

OTHER PUBLICATIONS

International Search Report for PCT/US99/12861.

M. Bhatnagar, et al., Analysis of Silicon Carbide Power Device Performance, IEEE, 1991, pp. 176–180.

Robert J. Trew, et al., The Potential of Diamond and SiC Electronic Devices for Microwave and Millimeter—Wave power Applications, Proceedings of the IEEE, 1991, pp. 598–620.

Krishna Shenai, et al., Optimum Semiconductors for High–Power Electronics, IEEE Transactions on Electron Devices, vol. 36, No. 9, Sep. 1989, pp. 1811–1823.

John W.Baumgarner, et al., Monocrystalline β–SiC Semiconductor Thin Films: Epitaxial Growth, Doping, and FET Device Development, 1988 Proceedings $38^{th}$ Electronic Components Conference, IEEE, pp. 342–349.

H.Daimon, et al., Operation of Schotky–Barrier Field–Effect Transistors of 3C–SiC up to 400° C., Appl. Phys. Lett. 51 (25), Dec. 21, 1987, pp. 2106–2108.

Galina Kelner, et al., β–SiC MESFET's and Buried–Gate JFET's, IEEE Electron Device Letters, vol. EDL–8, No. 9, Sep. 1987, pp. 428–430.

Agarwal, Anant K., et al., Temperature Dependence of Fowler–Nordheim Current in 6H– and 4H–SiC MOS Capacitors, *IEEE Electron Device Letters,* vol. 18, No. 12, pp. 593–594 (Dec. 1997).

Shenoy, Praveen M., et al., The Planar 6H–SiC ACCUFET: A New High–Voltage Power MOSFET Structure, *IEEE Electron Device Letters,* vol. 18, No.12, pp. 589–591 (Dec. 1997).

H.S. Kong, et al., Temperature dependence ofthe Current-–Voltage Characteristics of Metal–Semiconductor Field–Effect Transistors in n–Type β–SiC Growth Via Chemical Vapor Deposition, Appl. Phys. Lett. 51 (6), Aug. 10, 1987, pp. 442–444.

G. Kelner, et al.,β–SiC MESFETs, Mat. Res. Soc. Symp. Proc., vol. 97, 1987, pp. 227–232.

SILICON CARBIDE HORIZONTAL CHANNEL BUFFERED GATE SEMICONDUCTOR DEVICES

FIELD OF THE INVENTION

The present invention relates to semiconductor devices and more particularly to such devices formed in silicon carbide. The present invention particularly relates to power devices formed in silicon carbide.

BACKGROUND OF THE INVENTION

Because of the physical properties of silicon carbide, silicon carbide has been considered a likely semiconductor material for use in high temperature and high power applications. As a result, various semiconductor devices in silicon carbide have been developed in attempts to take advantage of the promising properties of silicon carbide. These devices include Metal Oxide Semiconductor Field Effect Transistors (MOSFETs), Junction Field Effect Transistors (JFETs) and the ACCUFET.

In a power MOSFET, the gate electrode provides turn-on and turn-off control upon the application of an appropriate gate bias. For example, turn-on in an n-type enhancement MOSFET occurs when a conductive n-type inversion layer is formed in the p-type channel region in response to the application of a positive gate bias. The inversion layer electrically connects the n-type source and drain regions and allows for majority carrier conduction between source and drain.

The power MOSFET's gate electrode is separated from the conducting channel region by an intervening insulating layer, typically silicon dioxide. Because the gate is insulated from the channel region, little gate current is required to maintain the MOSFET in a conductive state or to switch the MOSFET from an on-state to an off-state or vice-versa. The gate current is small during switching because the gate electrode forms a capacitor with the MOSFET's channel region. Thus, only charging and discharging current ("displacement current") is required during switching. Because of the high input impedance associated with the insulated-gate electrode, minimal current demands are placed on the gate, and, therefore, the gate drive circuitry can be easily implemented.

Moreover, because current conduction in the MOSFET occurs through majority carrier transport only, the delay associated with the recombination of excess minority carriers is not present. Accordingly, the switching speed of power MOSFETs can be made orders of magnitude higher than that of bipolar transistors and thyristors. Unlike bipolar transistors and thyristors, power MOSFETs can be designed to simultaneously withstand high current densities and the application of high voltages for relatively long durations, without encountering the destructive failure mechanism known as "second breakdown" during switching transients. Power MOSFETs can also easily be paralleled, because the forward voltage drop of power MOSFETs increases with increasing temperature, thereby promoting an even current distribution in parallel connected devices. This is in contrast with devices relying on bipolar conduction such as the bipolar junction transistor or the thyristor where the on-state voltage drop is inversely proportional to the operating temperature.

The above-described beneficial characteristics of power MOSFETs are typically offset, however, by the relatively high on-resistance of the MOSFET's drift region for high voltage devices, which arises from the absence of minority carrier injection. As a result, a commercial silicon MOSFET's operating forward current density is typically limited to relatively low values, typically in the range of 40–50 A/cm$^2$, for a 600 V device, as compared to 100–120 A/cm$^2$ for the bipolar transistor for an identical on-state voltage drop.

A further limitation of MOSFETs in silicon carbide may also arise as a result of the MOSFET utilizing an inversion layer. As a result of the use of an inversion layer the low mobility of silicon carbide may result in high resistivities of the channel. Thus, the benefits of the advantageous properties of silicon carbide may be overshadowed by the limitations of the MOSFET device resulting from the utilization of an inversion layer and the low mobility of silicon carbide.

The ACCUFET was developed, at least in part, to overcome the limitations of the MOSFET. The ACCUFET uses separated buried base layers to protect the gate oxide from the base. The ACCUFET relies on an accumulation layer, rather than an inversion layer as in MOSFETs and, therefore, has a much higher channel mobility than a MOSFET in silicon carbide. The ACCUFET is further described in "The Planar 6H-SiC ACCUFET: A New High-Voltage Power MOSFET Structure" Shenoy et al., IEEE Electron Device Letters, Vol. 18, No. 12, December, 1997.

Furthermore, at high operating temperatures, the theoretical limits of a MOSFET or an ACCUFET may not be achievable because of gate oxide degradation by Fowler-Nordheim (F-N) current in the gate oxide. Fowler-Nordheim injection into the oxide may damage the oxide of the MOSFET and, ultimately, result in failure of the device by causing gate oxide breakdown. This breakdown may be further exacerbated by MOSFET structures which may have areas of field crowding at the oxide, for example at the corners of the oxide in the gate trench of a UMOSFET. See Agarwal, et al., *Temperature Dependence of Fowler-Nordheim Current in 6H- and 4H-SiC MOS Capacitors*, IEEE Electron Device Letters, Vol. 18, No. 12, December, 1997.

F-N injection or "hot electron" injection into the gate oxide may be even more problematic in semiconductor devices formed of silicon carbide because of the wide band gap of silicon carbide. This is because injection of inversion or accumulation layer carriers into the gate oxide is a function of the barrier height between the conduction band edge of silicon carbide and the conduction band edge of the gate oxide. Thus, it has been found that 4H-SiC with a band gap of 3.26 eV has a higher current density of F-N current than 6H-SiC with its bandgap of 2.85 eV. Agarwal, et al., *Temperature Dependence of Fowler-Nordheim Current in 6H- and 4H-SiC MOS Capacitors*, IEEE Electron Device Letters, Vol. 18, No. 12, December, 1997. This problem may be further exacerbated at high temperatures where the effective barrier height between the silicon carbide and gate insulator is reduced by statistical spreading in the carrier energy. Thus, devices which may appear extremely attractive in SiC may be limited by time-dependent dielectric breakdown as a result of F-N current in the gate oxide during both on-state and off-state operation of 4H-SiC MOS based devices such as the MOSFET and the ACCUFET.

An alternative to the MOSFET and the ACCUFET, the junction field effect transistor (JFET) may provide good gate control of current and voltage with a low on-state voltage drop. Furthermore, the JFET may be very reliable and provide good high temperature operation. Because the JFET does not have the semiconductor-oxide interface of the MOSFET and ACCUFET the breakdown of the oxide resulting from F-N currents may not present a problem. However, the JFET is a "normally on" device which may limit its applicability in many circuits. This is because the reliability of a power system may be compromised during gate drive failures. JFETs also suffer from relatively low voltage gains (ratio of drain voltage to gate voltage). Thus, a large gate bias may be required when the device is in the off state. The JFET's maximum breakdown voltage may also be limited by the gate-source breakdown voltage. Furthermore, the JFET may also have large leakage currents.

In light of the above discussion, there exists a need for improvements in high voltage power silicon carbide devices which offer a convenient gate control.

OBJECTS AND SUMMARY OF THE INVENTION

In view of the foregoing, it is one object of the present invention to provide a silicon carbide power device.

A further object of the present invention is to provide a silicon carbide power device which can have increased reliability over MOS devices.

Yet another object of the present invention is to provide a silicon carbide power device which can reduce the effects of Fowler-Nordheim current.

Still another object of the present invention is to provide a normally off semiconductor device.

These and other objects of the present invention are provided by silicon carbide channel semiconductor devices which eliminate the insulator of the gate by utilizing a semiconductor gate layer and buried base regions to create a "pinched off" gate region when no bias is applied to the gate. The elimination of the insulating layer of the gate may eliminate the impact of the F-N current problem associated with MOSFETs and ACCUFETs. Application of a bias to the gate causes a conducting channel to form between the base region and the gate layer to allow carrier flow. By eliminating the insulating gate while still providing a normally off device, the present invention may overcome many of the limitations of the previous devices, such as the MOSFET, the ACCUFET and the JFET for use in high temperature applications. Use of a semiconductor material as the gate layer to provide a pn junction in the channel region in devices of the present invention may buffer the channel formed in the drift layer, and thus may reduce any "hot electron" effect on the gate layer.

In particular embodiments of the present invention, the semiconductor devices include a silicon carbide drift layer of a first conductivity type, the silicon carbide drift layer having a first face and having a channel region therein. A buried base region of a second conductivity type semiconductor material is provided in the silicon carbide drift layer so as to define the channel region. A gate layer of a second conductivity type semiconductor material is formed on the first face of the silicon carbide drift layer adjacent the channel region of the silicon carbide drift layer. A gate contact may also be formed on the gate layer.

A source region of first conductivity type semiconductor material may also be provided between the buried base region and the first face of the drift layer. The source region is doped to a carrier concentration greater than a carrier concentration of the drift layer. A drain region of first conductivity type semiconductor material may also be provided adjacent a second face of the drift layer so that the semiconductor device comprises a vertical device having a lateral silicon carbide channel region.

In particular embodiments, the silicon carbide channel semiconductor device may further include a layer of highly doped first conductivity type semiconductor material between the gate layer and the gate contact. This layer may provide a reverse biased diode when a positive gate bias is applied so as to limit gate to source current when the device is in operation. Alternatively, a diode having its cathode connected to the gate contact may be provided external to the semiconductor device so as to limit gate current.

In still another embodiment of the present invention, a silicon carbide channel semiconductor device is provided where the first conductivity type is n-type conductivity and the second conductivity type is p-type conductivity. Alternatively, the first conductivity type may be p-type conductivity and the second conductivity type n-type conductivity.

Furthermore, a device may be provided which includes a silicon carbide substrate adjacent a second face of the silicon carbide drift layer opposite the first face of the silicon carbide drift layer. In such a device a horizontal channel buffered gate transistor may be provided where the silicon carbide substrate is a highly doped silicon carbide substrate of the first conductivity type. A horizontal channel buffered gate thyristor may also be provided where the silicon carbide substrate is a highly doped silicon carbide substrate of the second conductivity type. In either case, the first conductivity type may be n-type conductivity and the second conductivity type may be p-type conductivity or the first conductivity type may be n-type conductivity and the second conductivity type may be p-type conductivity.

In devices according to the present invention, the semiconductor material of the buried base region and the gate layer may be silicon carbide, gallium nitride or indium gallium nitride. Furthermore, the source region may be electrically connected to the base region.

In a transistor embodiment of the present invention, a unit cell of the silicon carbide channel transistor includes a silicon carbide substrate of a first conductivity type which is doped to have a first carrier concentration. A first layer of silicon carbide of the first conductivity type is formed on the silicon carbide substrate has a doping and thickness corresponding to the desired breakdown voltage of the device. This doping typically results in the first layer having a carrier concentration less than the first carrier concentration. A buried region of a second conductivity type semiconductor material is formed in the first layer of silicon carbide and extends below a channel region of the first layer of silicon carbide. A first region of semiconductor material of the first conductivity type is doped to a carrier concentration of greater than the carrier concentration of the first layer of silicon carbide. The first region of semiconductor material of the first conductivity type is formed between the buried region of semiconductor material and a face of the first layer of silicon carbide opposite the substrate and adjacent the channel region of the first layer of silicon carbide.

A gate layer of semiconductor material of the second conductivity type is formed on the first layer of silicon carbide and extends from the first region of semiconductor material to the channel region of the first layer of silicon carbide. A gate contact is also formed on the gate layer of semiconductor material so as to define the channel region of the first layer of silicon carbide. A first ohmic metal contact is formed on the first region of semiconductor material and a second ohmic metal contact is formed on the silicon carbide substrate opposite the first layer of silicon carbide. Optionally, a layer of highly doped first conductivity type semiconductor material may be provided between the gate layer and the gate contact.

In a thyristor embodiment of the present invention a unit cell of a silicon carbide channel thyristor includes a silicon carbide substrate of a second conductivity type doped to have a first carrier concentration. A first layer of silicon carbide of a first conductivity type is formed on the silicon carbide substrate is doped to have a carrier concentration less than the first carrier concentration. A buried region of the second conductivity type semiconductor material is formed in the first layer of silicon carbide extends below a channel region of the first layer of silicon carbide. A first region of semiconductor material of the first conductivity type, doped to a carrier concentration of greater than the carrier concentration of the first layer of silicon carbide, is formed between the buried region of semiconductor material and a face of the first layer of silicon carbide opposite the substrate and adjacent the channel region of the first layer of silicon carbide. A gate layer of semiconductor material of the second conductivity type is formed on the first layer of silicon carbide and extends from the first region of semiconductor material to the channel region of the first layer of silicon carbide. A gate contact is formed on the gate layer of semiconductor material so as to define the channel region of the first layer of silicon carbide. A first contact is formed on the first region of semiconductor material and a second contact is formed on the silicon carbide substrate opposite the first layer of silicon carbide. Optionally, a layer of highly doped first conductivity type semiconductor material may be formed between the gate layer and the gate contact.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. As will also be appreciated by those of skill in the art, references herein to a layer formed "on" a substrate or other layer may refer to the layer formed directly on the substrate or other layer or on an intervening layer or layers formed on the substrate or other layer. As will also be appreciated by those of skill in the art, while the present invention is described with respect to layers, such layers may be formed epitaxially or by implantation. Accordingly, the present invention is not limited to the relative size and spacing illustrated in the accompanying figures.

Figure 1:
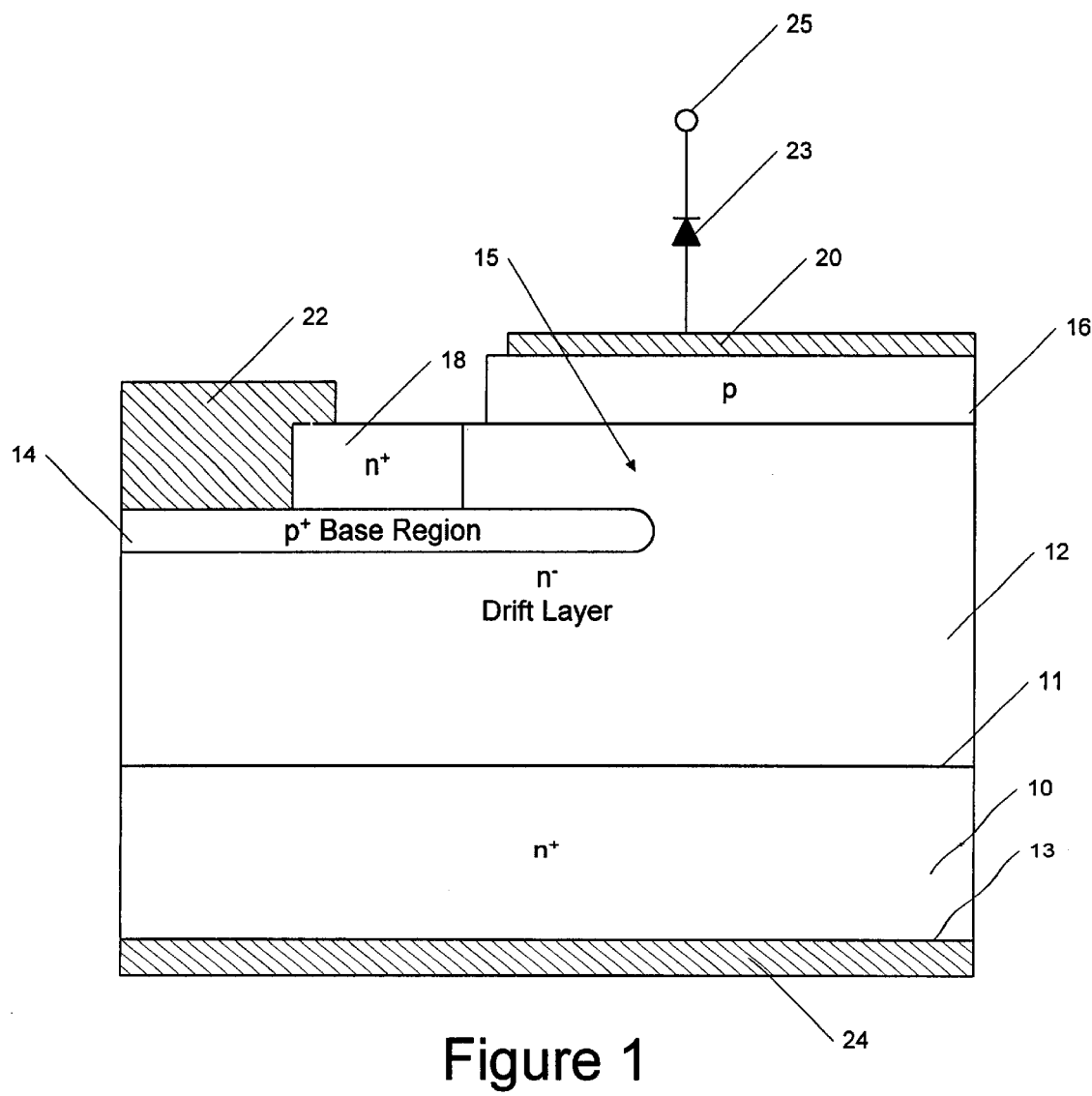
FIG. 1 is cross-sectional view of a unit cell of a first embodiment of the present invention.
Figure 3:
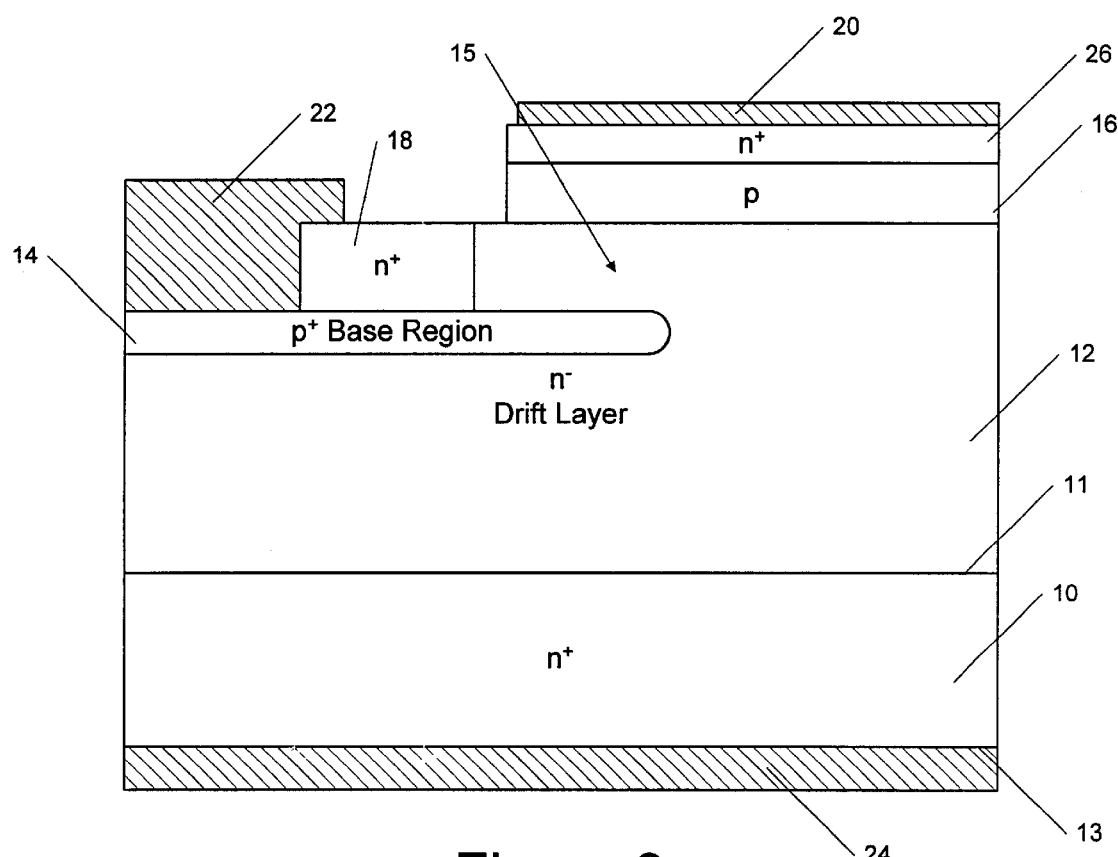
FIG. 3 is a cross-sectional view of a second embodiment of the present invention.
Figure 5:
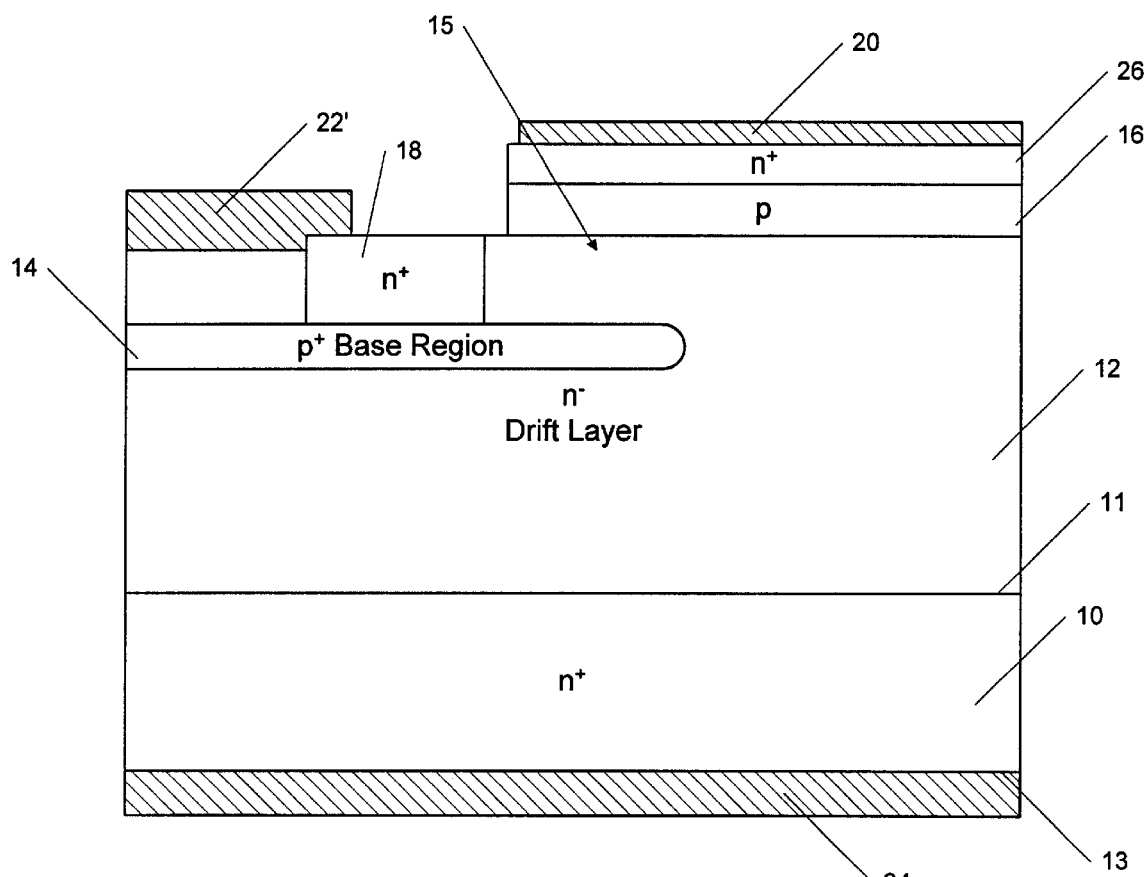
FIG. 5 is a cross-sectional view of a fourth embodiment of the present invention.

FIGS. 1, 3 and 5 illustrate unit cells of various embodiments of the present invention. By mirroring these unit cells around both the vertical peripheries of the unit cell, devices of multiple unit cells may be produced. As will be appreciated by those of skill in the art, the unit cells of the present invention may also be utilized to make a single unit cell device by mirroring the unit cell about the right vertical periphery of the device.

A horizontal channel buffered gate transistor (HCBGT) of the present invention illustrated in FIG. 1 includes a bulk single crystal silicon carbide substrate 10 of a first conductivity type silicon carbide and having a first face 11. As illustrated in FIG. 1, this first conductivity type silicon carbide may be n-type conductivity silicon carbide. The substrate 10 has an upper surface or first face 11 and a lower surface or second face 13 opposite the upper surface. A first layer 12 of first conductivity type silicon carbide may be formed on the first face 11 of the substrate 10 to form a drift region. As is illustrated in FIG. 1, the drift region 12 may be an $n^-$ silicon carbide drift layer. Alternatively, an $n^-$ substrate could have an $n^+$ region implanted in the lower surface of the substrate so as to provide $n^+$ and $n^-$ regions in the substrate. Thus, as used herein references to the substrate and first layer refer to layers formed both on the substrate and in the substrate. The carrier concentration of the substrate 10 is higher than the carrier concentration of the first layer 12. Thus, the substrate may be referred to as an $n^+$ substrate. Sheet resistivities of less than 1 Ω-cm are preferred for the substrate 10. Carrier concentrations of from about $10^{12}$ cm$^{-3}$ to about $10^{17}$ cm$^{-3}$ may be suitable for the first layer 12. The substrate may have a thickness of from about 100 μm to about 500 μm. The first layer 12 may have a thickness of from about 3 μm to about 500 μm.

Formed in the first layer 12 is a region of semiconductor material 14 of a second conductivity type to provide a base region of opposite conductivity type to that of the first layer 12. The base region 14 may be epitaxially grown or implanted in the first layer 12 and in the embodiment illustrated in FIG. 1 is formed of p-type conductivity semiconductor material. Also formed in the first layer 12 is region 18 of $n^+$ conductivity semiconductor material which forms a source of the device. As is illustrated in FIG. 1, the source region 18 is formed so as to contact the base region 14, however, the base region 14 extends beyond the source region 18 into a channel region 15 which is formed in the first layer 12. The $n^+$ source regions 18 are preferably from about 1 μm to about 5 μm wide and preferably extend under the gate as little as possible. For example, this distance may range from about 0.5 μm to about 3 μm. Carrier concentrations of greater than about $10^{18}$ cm$^{-3}$ may be suitable for the $n^+$ regions 18. The semiconductor material of either or both the base region 14 and the source region 18 may be silicon carbide or may be other semiconductor materials such as gallium nitride (GaN) or indium gallium nitride (InGaN).

The base region 14 preferably has a carrier concentration of from about $10^{16}$ cm$^{-3}$ to about $10^{18}$ cm$^{-3}$ and a thickness of from about 0.3 μm to about 5 μm. The base region 14 preferably extends past the source region 18 from about 3 μm to about 12 μm. Carrier concentrations of greater than about $10^{18}$ cm$^{-3}$ maybe suitable for the $n^+$ source region 18.

Also illustrated in FIG. 1 is a second conductivity type semiconductor material gate layer 16 formed on the drift layer 12 ana extended to the source region 18. Because the gate layer 16 is a semiconductor material and not an insulator, it electrically contacts the drift layer 12. As illustrated in the embodiment of FIG. 1, this second conductivity type gate layer is a p-type semiconductor material gate layer. The semiconductor material of the gate layer 16 may be silicon carbide or may be other semiconductor materials such as gallium nitride (GaN) or indium gallium nitride (InGaN).

As is further seen in FIG. 1, gate contact 20 is formed on the gate layer 16 and a source contact 22 is formed so as to electrically connect the source region 18. As is further illustrated in FIG. 1, the source contact may be formed so as to contact both the source region 18 and the base region 14. A drain contact 24 is also formed on a face of substrate 10 opposite the first layer 12. The contacts 20, 22 and 24 may be made of any suitable material for forming ohmic contacts as described below.

The p-type gate layer 16 serves to isolate a gate contact 20 from the first layer 12 such that when a bias voltage is applied to the gate contact 20 a conductive channel forms in the channel region 15. When no bias is applied to the gate contact 20, the channel is pinched off between the gate layer 16 and the base region 14 such that current does not flow from the source contact 22 to the drain contact 24. In order to achieve the normally off condition, the doping levels of the first layer 12, base region 14 and gate layer 16 as well as the spacing between the base region 14 and the gate layer 16 should be selected so as to deplete the channel region 15 between the base region 14 and the gate layer 16 of carriers.

In on-state operation, when a positive bias is applied to gate contact 20, an electrically conductive channel is formed in the channel region 15 below the gate layer and current is allowed to flow from source contact 22 to drain contact 24. However, because of the p/n junction between the gate layer 16 and the source region 18 current will flow from the gate to the source if the voltage is applied to the gate greater than the built-in voltage of the p/n junction such that the gate to source junction acts like a forward biased diode. In one embodiment of the present invention, the gate current of the device according to the present invention may be limited by applying the gate voltage to the gate contact through a reverse biased diode 23. This diode may be a discrete device separate from the HCBGT structure of FIG. 1. In such a case, the positive gate voltage would be applied to a terminal 25 connected to the anode of the diode 23 with the diode 23 having its cathode electrically connected to the gate contact 20.

Figure 2:
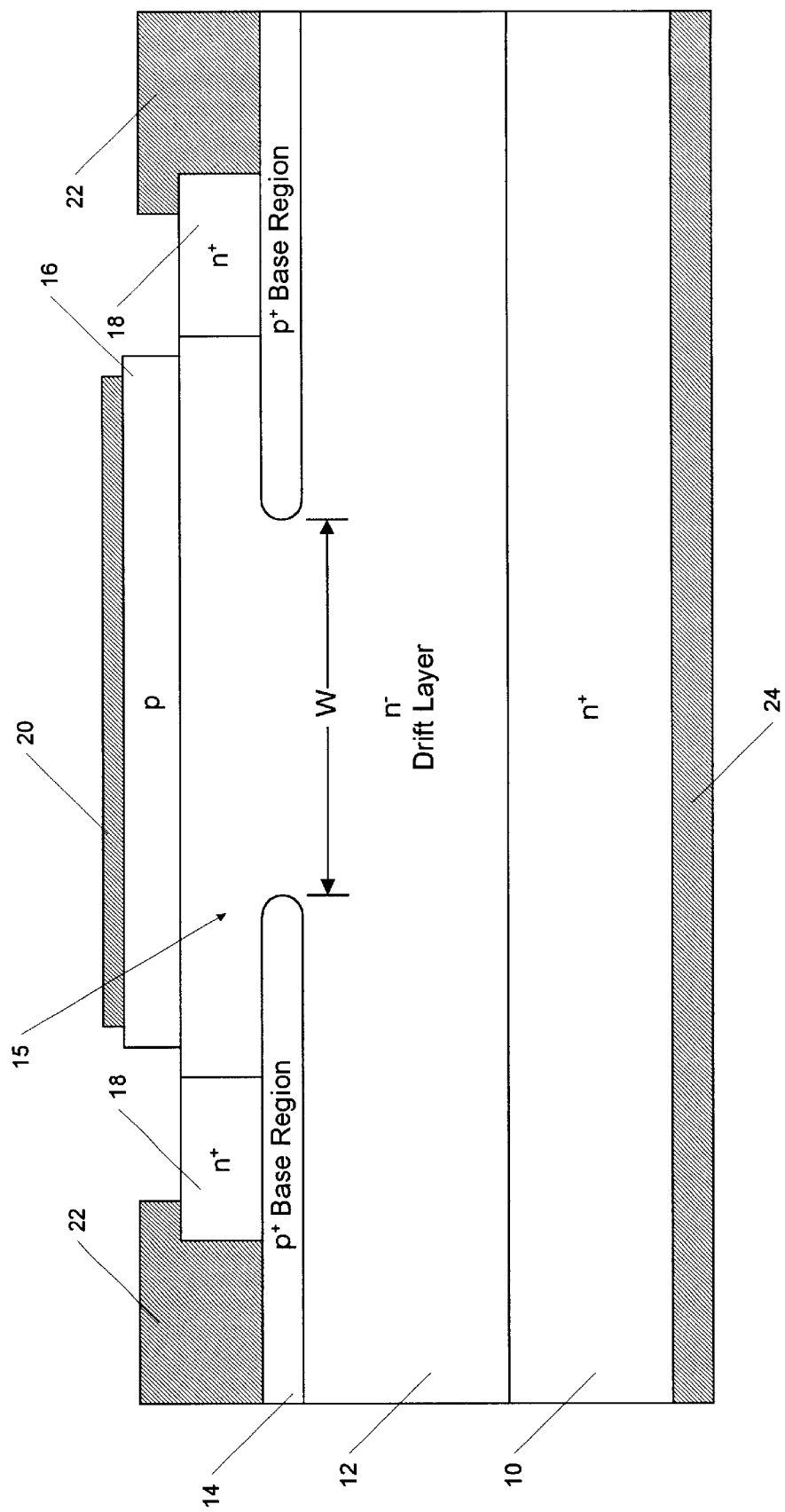
FIG. 2 is a cross-sectional view of a two-unit cell device according to the present invention.

FIG. 2 illustrates a device including two unit cells of FIG. 1. As seen in FIG. 2, the base regions 16 are spaced apart by a distance W. The distance W may be adjusted so as to control the operating characteristics of the present invention. In general, as the distance W is decreased the resistance offered by the device increases but a more effective channel pinch-off may result. However, is a large value of W is used, the channel density is reduced and for excessively large values of W, the channel and source resistance may become excessive. Furthermore, the distance W between adjacent base regions may depend upon the number of unit cells in the device and the desired operating characteristics.

As described above, the base region 14 is preferably of a thickness of from about 0.3 $\mu$m to about 5 $\mu$m and extends beneath the gate contact 20 from about 3 $\mu$m to about 12 $\mu$m. However, the distance which the base region 14 extends beneath the gate contact may vary depending on the particular application. In particular, the space between base region 18 beneath a gate contact may be utilized to adjust the resistance and electric field in the channel region 15. As the space W between base regions 14 decreases the electric field near the gate layer 16 may be reduced. Spacings of from about 1 $\mu$m to about 20 $\mu$m may be suitable. As described above, preferably the doping of the drift layer 12 and base region 14 are selected such that the drift layer 12 is completely depleted by the built-in potentials of the p$^+$n junction of the base region and the n/p$^+$ gate junction at a zero gate bias.

FIG. 3 illustrates an alternative HCBGT according to the present invention. As seen in FIG. 3, the unit cell of FIG. 1 further includes a second gate layer 26 of first conductivity type semiconductor material formed between the gate layer 18 and the gate contact 20. The second gate layer 26 illustrated in FIG. 3 is n-type semiconductor material. The n-type semiconductor material is preferably silicon carbide but may also be formed of gallium nitride or indium gallium nitride. The doping and thickness of the first and second gate layers 16 and 26 are selected such that the breakdown of the n$^+$p$^+$n$^-$ transistor is greater than the applied gate bias. Carrier concentrations of from about $5 \times 10^{16}$ cm$^{-3}$ to about $1 \times 10^{18}$ cm$^{-3}$ may be utilized for the second gate layer 26. Thickness of from about 0.3 $\mu$m to about 3 $\mu$m may be suitable for the second gate layer 26 and from about 0.3 $\mu$m to about 3 $\mu$m for the first gate layer 16. However, as will be appreciated by those of skill in the art, various other levels of doping and thickness may be used based upon the materials which form the gate layers 16 and 26. Other characteristics of devices incorporating the unit cell of FIG. 3 may be essentially the same as specified herein with respect to FIG. 1.

By including the second gate layer 26, a reverse biased p/n junction may be incorporated into the gate structure of the HCBGT to block current flow from the gate contact 20 to the source contact 22 when a positive bias is applied to the gate terminal. Thus, devices incorporating the unit cell of FIG. 3 do not require an external diode to avoid gate currents.

Figure 4:
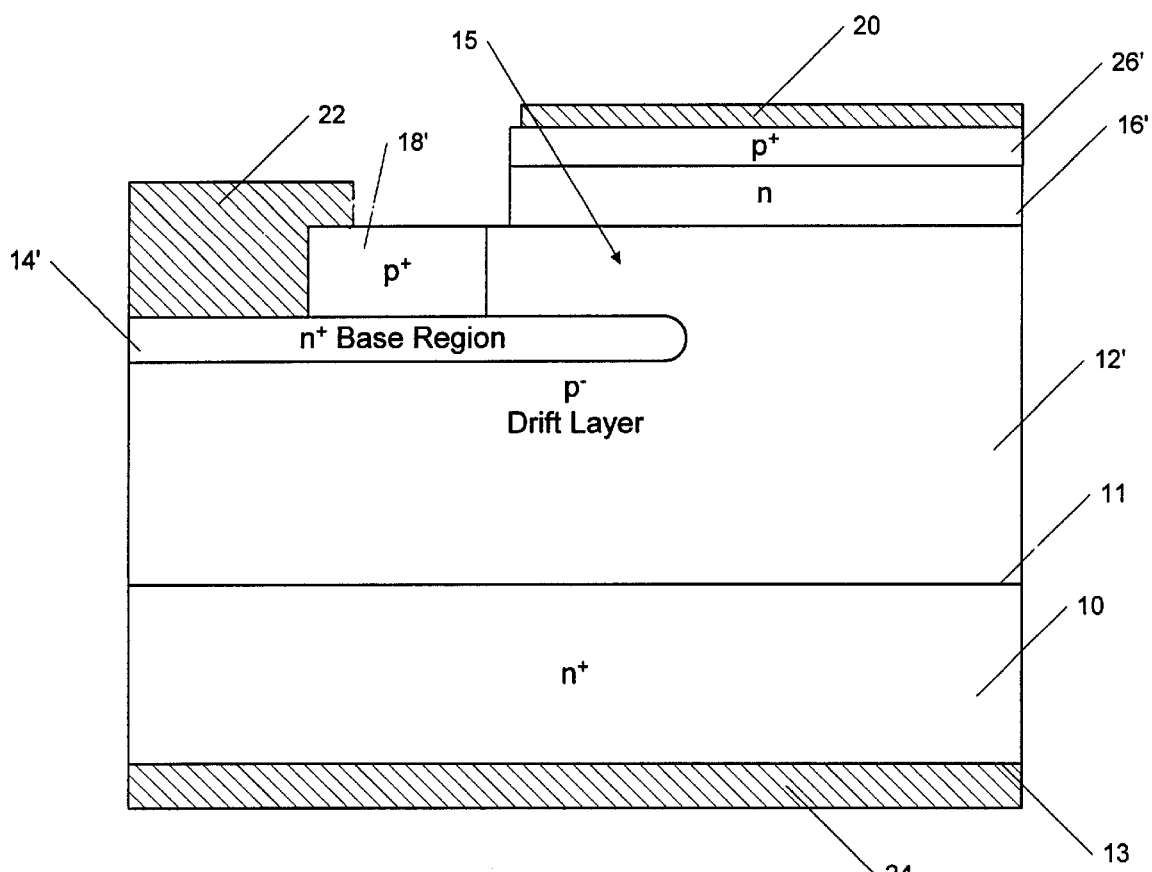
FIG. 4 is a cross-sectional view of a third embodiment of the present invention.

FIG. 4 illustrates a horizontal channel buffered gate thyristor (HCBGTh) according to the present invention. As is seen in FIG. 4, the structure of the HCBGTh is similar to that of the HCBGT. The substrate 10 is formed of first conductivity type semiconductor material. As illustrated in FIG. 4, the substrate may, therefore, be a n-type silicon carbide substrate or, as is described above an n-type silicon carbide layer. The primary difference between the device of FIG. 4 and that of FIG. 3 is that the conductivity type of the regions formed on the substrate are the opposite of those of FIG. 3. Thus, the drift layer is an p$^-$ drift layer 12', the base region is an n$^+$ base region 14', the first gate layer is an n-type gate layer 16' and the second gate layer is a p-type gate layer 26'. Furthermore, the source region 18 of FIGS. 1 through 3 and source contact 22 would be an emitter region 18' which is a p$^+$ emitter region and emitter contact 22 and the drain contact 24 would be a collector contact 24. In such a device, current would flow from the emitter contact 22 to the collector contact 24 when a bias is applied to the gate contact 20. Suitable carrier concentrations and dimensions for the n-type and p-type regions are comparable to those for the n-type and p-type regions of the devices of FIGS. 1 through 3.

The HCBGTh illustrated in FIG. 4 includes the optional p-type layer 26' to provide the internal gate diode. As will be appreciated by those of skill in the art, this layer may be eliminated to provide a structure similar to that of FIG. 1. In such a case an external diode may be utilized to control gate currents when the device is operated.

FIG. 5 illustrates a further embodiment of the present invention. In each of the devices of FIGS. 1 through 4, the source contact 22 and the buried base region 14 were electrically shorted. However, in the embodiment in FIG. 5, the gate contact 20 and first gate layer 16 are shorted to the base region in a third dimension. The source contact 22' is spaced apart from the base region by a portion of the drift layer 12. The HCBGT illustrated in FIG. 5 includes the optional n-type layer 26 to provide the internal gate diode. As will be appreciated by those of skill in the art, this layer may be eliminated to provide a structure similar to that of FIG. 1. In such a case an external diode may be utilized to control gate currents when the device is operated. Furthermore, the structure of FIG. 4 may also be modified in its gate design as reflected in FIG. 5 to provide a thyristor with its base region electrically connected to the gate layer and gate contact.

By shorting the p-base region 14 to gate 16 as illustrated in FIG. 5, a more effective pinch-off can be achieved. In this case, the depletion regions extend into the channel from both directions (top and bottom) rather than in only one direction (as in the structures of FIGS. 1 through 4). This may allow for a relatively wide channel region during on-state operation, thereby reducing the on-state resistance of the device.

While the devices above have been described with respect to the first conductivity type being n-type conductivity and the second conductivity type being p-type conductivity, as will be appreciated by those of skill in the art, complementary devices may also be produced according to the teachings of the present invention. Thus, the first conductivity type may be p-type conductivity and the second conductivity type may be n-type conductivity.

As will be appreciated by those of skill in the art, the various embodiments of the present invention may be fabricated utilizing conventional semiconductor fabrication techniques. However, with respect to the formation of epitaxial layer 12, this layer is preferably grown on the substrate 10 utilizing an epitaxial growth process such as that described in U.S. Pat. No. 4,912,064, the disclosure of which is incorporated herein by reference as if set forth fully. As discussed above, alternatively, a lightly doped substrate may be utilized and an implant performed to provide the higher doped layer 10.

Devices according to the present invention may also be edge terminated by etching a mesa surrounding the device. The mesa (not shown) may extend through the first layer 12 and into the substrate 10. Alternatively, the mesa may extend partially through the first layer 12. In such a case, ions may be implanted in the exposed layer 12 to a depth of from about 100 Å to about 5 µm and to a distance of from about 5 µm to about 500 µm from the edge of the mesa. Such an implantation may be preferred as it allows for the gradual decrease in the electric field from the main junction to the edge of the termination region during the blocking mode of operation. Carrier concentrations of from about $5 \times 10^{15}$ cm$^{-3}$ to about $1 \times 10^{17}$ cm$^{-3}$ may be utilized to form a low doped region of opposite conductivity type to that of the first layer 12 which surrounds the mesa. In either case a passivation layer may then be formed on the exposed surfaces of the mesa (not shown). Such a passivation layer may be SiO$_2$ or other such suitable materials or stacked passivants known to those of skill in the art.

In each of the embodiments described above, the substrate and layers may be formed of silicon carbide selected from the group of 6H, 4H, 15R, or 3C silicon carbide, however, 4H silicon carbide is preferred for each of the devices described above. The preferred metals for ohmic contacts include nickel, tantalum silicide and platinum. Additionally, aluminum/titanium contacts may also be used to form the ohmic contacts of the present invention. While these particular metals have been described, any other metals known to those of skill in the art which form ohmic contacts with silicon carbide may be used.

With regard to the carrier concentrations or doping levels of the epitaxial layers and implanted regions of the devices described above, generally, the p$^+$ or n$^+$ conductivity type regions and epitaxial layers should be as heavily doped as possible without causing excessive crystal or epitaxial defects. Suitable dopants for producing the p-type regions include aluminum, boron or gallium. Suitable dopants for producing the n-type regions include nitrogen and phosphorus. Aluminum is the preferred dopant for the p$^+$ regions and it is preferred that the aluminum be implanted in the p$^+$ regions using high temperature ion implantation such as is described in U.S. Pat. No. 5,087,576, the disclosure of which is incorporated herein by reference as if set forth fully, and employing temperatures of between about 1000° C. and about 1500° C.

The devices described above can reduce the impact of F-N current by buffering the gate region with semiconductor material rather than the insulating layer of the gate of a MOSFET or ACCUFET. This buffer layer may effectively reduce the F-N current and, thereby, reduce the device degradation resulting from such currents. Furthermore, the devices according to the present invention may be "normally off" devices, thereby overcoming the limitations of the JFET in many applications. Since the channel region is horizontal, a much larger gate can be formed than a vertically walled JFET. This allows an advantageous blocking gain/on-resistance trade off. In generally, larger gate regions lead to higher blocking gains an lower leakage currents. Since the HCBGT is a normally off device, it requires a large gate region which is not possible in a vertical gate structure.

The conducting channel during the on-state operation of the HCBGT is 3-D bulk silicon carbide formed in the undepleted portion between the p$^+$ gate 16 and the p base regions 14. This is in contrast to a MOS control devices that conduct using a 2-D sheet charge. Since the conduction in the HCBGT occurs in the bulk, low-doped silicon carbide, it offers a much higher carrier mobility (10 to 100 times) than MOS gated devices. Since the conducting channel is away from the junction, no hot electron injection occurs in the HCBGT design and, thus, the damage from such injection does not occur. Therefore, the present invention may provide devices capable of operating at high voltages, high currents and high operating temperatures over extended periods of time.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A silicon carbide channel semiconductor device, comprising:
   a silicon carbide drift layer of a first conductivity type, the silicon carbide drift layer having a first face;
   a buried base region of a second conductivity type semiconductor material in the silicon carbide drift layer so as to define a channel region;

a gate layer of a second conductivity type semiconductor material on the first face of the silicon carbide drift layer adjacent and electrically contacting the channel region of the silicon carbide drift layer; and a gate contact on the gate layer.

2. A silicon carbide channel semiconductor device according to claim 1, further comprising:

a first region of first conductivity type semiconductor material between the buried base region and the first face of the drift layer, wherein the first region is doped to a carrier concentration greater than a carrier concentration of the drift layer; and a second region of semiconductor material adjacent a second face of the drift layer opposite the first face so that the semiconductor device comprises a vertical device having a lateral silicon carbide channel region.

3. A silicon carbide channel semiconductor device according to claim 1, further comprising a layer of highly doped first conductivity type semiconductor material between the gate layer and the gate contact.

4. A silicon carbide channel semiconductor device according to claim 1, wherein the first conductivity type is n-type conductivity and the second conductivity type is p-type conductivity.

5. A silicon carbide channel semiconductor device according to claim 2, wherein the second region of semiconductor material comprises a silicon carbide substrate and wherein the silicon carbide substrate is adjacent the second face of the silicon carbide drift layer.

6. A silicon carbide channel semiconductor device according to claim 5, wherein the silicon carbide substrate is a highly doped silicon carbide substrate of the first conductivity type and provides a drain region of the semiconductor device.

7. A silicon carbide channel semiconductor device according to claim 6, wherein the first conductivity type is n-type conductivity and the second conductivity type is p-type conductivity.

8. A silicon carbide channel semiconductor device according to claim 5, wherein the silicon carbide substrate is a highly doped silicon carbide substrate of the second conductivity type and provides a collector region of the silicon carbide device.

9. A silicon carbide channel semiconductor device according to claim 8, wherein the first conductivity type is n-type conductivity and the second conductivity type is p-type conductivity.

10. A silicon carbide channel semiconductor device according to claim 8, wherein the first conductivity type is p-type conductivity and the second conductivity type is n-type conductivity.

11. A silicon carbide channel semiconductor device according to claim 1, wherein the semiconductor material of the buried base region and the gate layer is silicon carbide.

12. A silicon carbide channel semiconductor device according to claim 1, wherein the semiconductor material of the buried base region and the gate layer is selected from the group consisting of gallium nitride and indium gallium nitride.

13. A silicon carbide channel semiconductor device according to claim 2, wherein the first region of semiconductor material is electrically connected to the base region.

14. A silicon carbide channel semiconductor device according to claim 2, wherein the buried base region of semiconductor material is electrically connected to the gate layer and the gate contact. 15.

15. A silicon carbide channel semiconductor device according to claim 1, further comprising a diode having its cathode connected to the gate contact.

16. A unit cell of a silicon carbide channel transistor comprising:

a silicon carbide substrate of a first conductivity type and having a first carrier concentration;

a first layer of silicon carbide of the first conductivity type on the silicon carbide substrate and having a carrier concentration less than the first carrier concentration;

a buried region of a second conductivity type semiconductor material in the first layer of silicon carbide that defines a channel region between the first face and the buried region;

a first region of semiconductor material of the first conductivity type and being doped to a carrier concentration of greater than the carrier concentration of the first layer of silicon carbide, wherein the first region of semiconductor material of the first conductivity type is between the buried region of semiconductor material and a face of the first layer of silicon carbide opposite the substrate and adjacent the channel region of the first layer of silicon carbide;

a gate layer of semiconductor material of the second conductivity type on the first layer of silicon carbide wherein the gate layer is adjacent but spaced apart from the first region of semiconductor material and extends to cover the channel region of the first layer of silicon carbide;

a gate contact on the gate layer of semiconductor material so as to define the channel region of the first layer of silicon carbide;

a first contact on the first region of semiconductor material; and a second contact on the silicon carbide substrate opposite the first layer of silicon carbide.

17. A silicon carbide channel transistor according to claim 16, further comprising a layer of highly doped first conductivity type semiconductor material between the gate layer and the gate contact.

18. A silicon carbide channel transistor according to claim 16, wherein the first conductivity type is n-type conductivity and the second conductivity type is p-type conductivity.

19. A silicon carbide channel transistor according to claim 16, wherein the first conductivity type is p-type conductivity and the second conductivity type is n-type conductivity.

20. A silicon carbide channel transistor according to claim 16, wherein the semiconductor material of the buried region and the gate layer is silicon carbide.

21. A silicon carbide channel transistor according to claim 16, wherein the semiconductor material of the buried region and the gate layer is selected from the group consisting of gallium nitride and indium gallium nitride.

22. A silicon carbide channel transistor according to claim 16, wherein the first region of semiconductor material is electrically connected to the buried region.

23. A silicon carbide channel transistor according to claim 16, wherein the buried region of semiconductor material is electrically connected to the gate layer and the gate contact.

24. A silicon carbide channel transistor according to claim 16, further comprising a diode having its cathode connected to the gate contact.

25. A unit cell of a silicon carbide channel thyristor comprising:

a silicon carbide substrate of a second conductivity type and having a first carrier concentration;

a first layer of silicon carbide of a first conductivity type on the silicon carbide substrate and having a carrier concentration less than the first carrier concentration;

a buried region of the second conductivity type semiconductor material in the first layer of silicon carbide that defines a channel region between the first face and the buried region;

a first region of semiconductor material of the first conductivity type and being doped to a carrier concentration of greater than the carrier concentration of the first layer of silicon carbide, wherein the first region of semiconductor material of the first conductivity type is between the buried region of semiconductor material and a face of the first layer of silicon carbide opposite the substrate and adjacent the channel region of the first layer of silicon carbide;

a gate layer of semiconductor material of the second conductivity type on the first layer of silicon carbide wherein the gate layer is adjacent but spaced apart from the first region of semiconductor material and extends to cover the channel region of the first layer of silicon carbide;

a gate contact on the gate layer of semiconductor material so as to define the channel region of the first layer of silicon carbide;

a first contact on the first region of semiconductor material; and a second contact on the silicon carbide substrate opposite the first layer of silicon carbide.

26. A silicon carbide channel thyristor according to claim 25, further comprising a layer of highly doped first conductivity type semiconductor material between the gate layer and the gate contact.

27. A silicon carbide channel thyristor according to claim 25, wherein the first conductivity type is n-type conductivity and the second conductivity type is p-type conductivity.

28. A silicon carbide channel thyristor according to claim 25, wherein the first conductivity type is p-type conductivity and the second conductivity type is n-type conductivity.

29. A silicon carbide channel thyristor according to claim 25, wherein the semiconductor material of the buried region and the gate layer is silicon carbide.

30. A silicon carbide channel thyristor according to claim 25, wherein the semiconductor material of the buried region and the gate layer is selected from the group consisting of gallium nitride and indium gallium nitride.

31. A silicon carbide channel thyristor according to claim 25, wherein the first region of semiconductor material is electrically connected to the buried region.

32. A silicon carbide channel thyristor according to claim 25, wherein the buried region of semiconductor material is electrically connected to the gate layer and the gate contact.

33. A silicon carbide channel thyristor according to claim 25, further comprising a diode having its cathode connected to the gate contact.

* * * * *

UNITED STATES PATENT AND TRADEMARK OFFICE
CERTIFICATE OF CORRECTION

PATENT NO. : 6,281,521 B1  
DATED : August 28, 2001  
INVENTOR(S) : Ranbir Singh Page 1 of 1

It is certified that error appears in the above-identified patent and that said Letters Patent is hereby corrected as shown below:

<u>Column 11, claim 14,</u>  
Line 64, please delete "[15.]"

Signed and Sealed this

Twenty-sixth Day of March, 2002

Attest:

JAMES E. ROGAN  
*Attesting Officer*   *Director of the United States Patent and Trademark Office*